(12) United States Patent
Mendenhall

(10) Patent No.: US 7,167,048 B2
(45) Date of Patent: Jan. 23, 2007

(54) METHOD AND APPARATUS FOR REDUCING RIPPLE IN CLASS D AMPLIFIERS

(75) Inventor: Eric Mendenhall, Dove Canyon, CA (US)

(73) Assignee: RGB Systems, Inc., Anaheim, CA (US)

( * ) Notice: Subject to any disclaimer, the term of this patent is extended or adjusted under 35 U.S.C. 154(b) by 109 days.

(21) Appl. No.: 10/908,063

(22) Filed: Apr. 26, 2005

(65) Prior Publication Data

US 2005/0264354 A1    Dec. 1, 2005

Related U.S. Application Data

(60) Provisional application No. 60/565,261, filed on Apr. 26, 2004.

(51) Int. Cl.
*H03F 3/217* (2006.01)

(52) U.S. Cl. .................. 330/251; 330/207 A

(58) Field of Classification Search ............ 330/251, 330/207 A, 10, 146
See application file for complete search history.

(56) References Cited

U.S. PATENT DOCUMENTS 5,117,198 A * 5/1992 Morenz .................. 330/251
6,388,514 B1 * 5/2002 King et al. ............... 330/10
6,778,012 B2 * 8/2004 Kirn ........................ 330/10

OTHER PUBLICATIONS

Website www.maxim-ic.com—article entitled *Class D Audio Amplifier Output Filter Optimization*, pp. 1-7, APP624 of Apr. 1, 2002.
Marshall Leach, Jr., *The Class-D Amplifier, Introduction to Electroacoustics and Audio Amplifier Design*, Second Edition—Revised Printing, published by Kendall/Hunt 2001, pp. 1-6.
Lloyd Dixon, *Average Current Mode Control of Switching Power Supplies*, pp. 5-1 to 5-14.
*Converters with Integrated Magnetics*, pp. 263-281.
Website www.maxim—article entitled *Class D Audio Amplifiers Save Battery Life*, APP 1760, Sep. 28, 2002.
Steve Somers, www.extron.com, article entitled Class D Amplifiers—Not 'Just Audio' pp. 1-5.

* cited by examiner

*Primary Examiner*—Henry Choe
(74) *Attorney, Agent, or Firm*—The Hecker Law Group, PLC

(57) ABSTRACT

Class D amplifiers are used for their high efficiency, but they have some undesirable characteristics, one of these being the residual switching frequency ripple. Embodiments of the present invention comprise methods and apparatuses for reducing the switching frequency ripple using a technique known herein as ripple steering. A secondary output is added to the amplifier for the purpose of steering the switching ripple away from the main output thus substantially relieving the main output from a major artifact of prior art Class D amplifiers.

11 Claims, 8 Drawing Sheets

METHOD AND APPARATUS FOR REDUCING RIPPLE IN CLASS D AMPLIFIERS

CROSS REFERENCE TO RELATED APPLICATIONS

This application claims priority of U.S. Provisional Application No. 60/565,261 filed on Apr. 26, 2004, entitled "Class D Amplifier with Reduced Output Ripple and Increased Bandwidth", specification of which is herein incorporated by reference.

FIELD OF THE INVENTION

The present invention relates to Class D amplifiers.

BACKGROUND OF THE INVENTION

High quality audio power amplifiers are traditionally large, heavy, and inefficient. Typically these equipments are capable of high power audio output with very low total harmonic distortion (THD). However, these equipments achieve only approximately 25% efficiency under normal audio operating conditions because they typically use inefficient linear or quasi-linear amplifiers (e.g. Class A, B, G, and H).

In recent years, the demand for more efficient audio power amplifiers has increased. Thus the shift from Class B to Class D amplifiers for sound reproduction.

Class D amplifiers provide high efficiency, but typically have limited bandwidths, resulting in high THD at high audio frequencies.

A Class D amplifier is basically a switch-mode power supply modified to operate in four quadrants at high frequencies (e.g. audio frequencies). A switch-mode power supply uses pulse-width modulation (PWM) to control the ON/OFF duty cycle of power switching transistor(s) that provide power to a load. The efficiency is high because the switches are not operated in their linear region.

FIG. 1 is an illustration of a simplified Class D topology. As illustrated, a comparator circuit (not shown) inside the Pulse-Width Modulator 110 compares the amplitude of incoming analog audio signal 101 to the amplitude of a reference triangular waveform operating at an intended switching frequency. The comparator circuit switches its output high or low by comparing the incoming audio's amplitude against the amplitude of the triangular waveform. When audio signal 101 is above the amplitude of the triangular waveform, the comparator switches output D+ of the PWM 110 to the ON state. Output D+ remains ON for the duration of time while the input audio signal exceeds the amplitude of the triangular waveform. Conversely, while the input audio signal is below the amplitude of the triangular waveform, the output D+ of the PWM is at the OFF state. Output D− is the inverse, i.e., complementary of output D+.

The relationship between the input audio amplitude and the pulse-width modulator outputs D+, and D− is linear to a first order. The outputs D+ and D− of the comparator drive "totem-poled" transistor switches $Q_1$ and $Q_2$. Each transistor switch is a MOSFET device, with a diode device 131 coupled across its terminals to enable four quadrant switching. The topology shown in FIG. 1 is an example embodiment of a class D amplifier where the same type MOSFETs is used for both switches. Alternate embodiments include using complementary transistors, e.g. one p-type and one n-type MOSFET. For this reason the MOSFET symbol used shows no polarity.

Output filter 140 is typically a second order low-pass, e.g., LC configuration filter. The output filter 140 is essential for low pass filtering, or integrating, the carrier's varying pulse width duty cycle for reproduction of the original audio content while attenuating the switching carrier frequency.

For high fidelity audio reproduction, the operating (i.e. switching) frequency of the Class D power amplifier must be significantly higher than the bandwidth of the audio being reproduced. Thus, to reproduce higher bandwidth audio with higher fidelity requires relatively high switching frequency. However, the higher the switching frequency, the more the switching losses (i.e. reduced efficiency). Thus, a prior art Class D system is limited in efficiency and output bandwidth because of the inherent efficiency loss.

As discussed above, in a Class D amplifier, the high frequency switching waveform is filtered with an LC filter, e.g., a second order LC filter. Selection of the filter component values is very important and essential to maximizing performance. For instance, the corner frequency of the LC filter is chosen between the audio bandwidth of interest and the switching frequency. As the corner frequency moves closer to the switching frequency, higher switching frequency ripple content appears at the output. And, as the corner frequency approaches the audio bandwidth of interest, distortion increases in the audio reproduction. Thus, the tradeoff in corner frequency is between higher frequency ripple, and low audio bandwidth, leading to high distortion in the reproduced audio signal.

Although the higher frequency ripple is generally inaudible to the human ear, its presence is still undesirable for several reasons: (1) it is an emissions problem, for instance, it appears as artifacts in the AM radio band and other places; (2) it influences audio measurements; (3) provides a limitation on how clean the output signal looks to the end user; and (4) puts unwanted artifacts on a feedback signal fed to the control circuit, limiting the performance.

Generally, the corner frequency of the output filter is chosen for high bandwidth and low THD thus the compromise is high frequency ripple on the output. This high frequency ripple is a market stigma for Class D amplifiers even though the ripple is outside the audio bandwidth. A detailed discussion of the ripple problem is discussed below.

FIGS. 2 and 3 present a more detailed illustration of the ripple problems associated with prior art half bridge class D amplifiers. FIG. 2 is an illustration of a typical half bridge class D amplifier configuration. The associated waveforms are shown in FIG. 3. As illustrated, the half bridge Class D amplifier configuration comprises essentially of switches $Q_1$ and $Q_2$, which are coupled to a modulator; inductor $L_1$ coupled on one end to switching node 201; output capacitor $C_1$, which is coupled to the second end of inductor $L_1$ and across device $R_{LOAD}$; and device $R_{LOAD}$ (i.e. representing the impedance of the loudspeaker) which is coupled to the second end of inductor $L_1$ and in parallel with capacitor $C_1$. Two power sources of equal voltage, $V_D$, are needed for half bridge operation.

The LC filter (comprising essentially of inductor $L_1$ and capacitor $C_1$) is driven by a square wave at the switching frequency. A square wave voltage 310 is generated at the switching node 201 as a result of the modulator 110 driving the gates of transistors (MOSFETs) $Q_1$ and $Q_2$. Inductor $L_1$ integrates square wave voltage 310 into a triangular wave current 320. And finally, the triangular wave current 320 is integrated into a quasi-sine wave voltage 330 by the output capacitor $C_1$.

The ripple problem is clearly shown in waveform 330. In practice the voltage ripple on a full bandwidth class D amplifier can be on the order of one volt peak-to-peak (1 Vpp) with a fundamental of several hundred kHz, making it extremely prone to interfering with other electronic equipment, especially AM radio receivers. Modulation schemes in which the switching frequency is variable are particularly troublesome.

In order to reduce this ripple an LC series trap circuit is often used across $C_1$. This approach has several disadvantages. First, the Q of the LC trap must be extremely high in order to effectively shunt current away from $C_1$, whose impedance at the switching frequency is already well below an Ohm. Second, the trap is only effective at a single frequency. The higher the Q, the less effective the trap will be if the switching frequency is variable. The trap is also not very effective at attenuating harmonics of the switching frequency; although these are usually 20 dB down from the fundamental in relative terms, they can still present problems if their magnitude is too large in absolute terms.

Another standard method of reducing ripple would be to add another second order filter to the output, creating a fourth order filter. Some of the disadvantages of this method include that the inductor must be sized to handle the full output current, and the filter may add distortion due to nonlinearity in the devices used, and the filtered output is outside of the control of any feedback loop.

Another prior art method to handling the ripple problem is to add a second LC low-pass filter in the output thus effectively increasing the order of the output filter to four. However, fourth order filters pose controllability and linearity problems. In addition, the higher order filter increases the THD.

Class D amplifiers are often operated in a full bridge configuration to increase the output power without increasing the power supply voltages. Thus, for completeness, a full bridge conventional class D amplifier is shown in FIG. 4. The two inductors are shown as $L_{1A}$ and $L_{1B}$, and these may be implemented as two discrete inductors or as a single coupled inductor so long as the dot-orientation is consistent. Inductor $L_{1B}$ is coupled to switching node 401 representing the output of MOSFET switches $Q_3$ and $Q_4$. The base of MOSFET switch $Q_3$ is driven by signal D− from the output of the modulator and the base of MOSFET switch $Q_4$ is driven by signal D+ from the output of the modulator. The output of the class D amplifier is shown with one side grounded, but this is not necessary for operation. The resulting waveforms are similar to that discussed above for the half bridge configuration.

SUMMARY OF THE INVENTION

The invention is a method and apparatus for reducing ripple in class D amplifiers. A Class D amplifier is basically a switch mode power supply driven by a high frequency modulator (e.g. a pulse width modulator). Thus, high frequency switching ripple (e.g. high frequency switching noise) is commonplace in prior art class D amplifiers. A second order low-pass filter in the output of the class D amplifier is normally inadequate to provide low harmonic distortion and eliminate ripple. Thus, there is generally a compromise in choosing the corner frequency of the low-pass filter.

Selection of the corner frequency of the output low pass filter involves a tradeoff between high frequency ripple and distortion in the reproduced audio signal. As the corner frequency moves closer to the switching frequency, higher switching frequency ripple content appears at the output. And, as the corner frequency approaches the audio bandwidth of interest, distortion increases in the audio reproduction. Thus, the tradeoff in corner frequency is between higher frequency ripple, which is generally inaudible, and high distortion in the reproduced audio signal. Normally, ripple is compromised in favor of reduced THD.

One or more embodiments of the present invention provide zero ripple class D amplifiers such as may be used for audio reproduction applications. The zero ripple condition is achieved by adding an auxiliary output to the conventional class D amplifier. The auxiliary output may serve no other useful function other than to steer ripple away from the primary output. Thus, a half-bridge class D would have one auxiliary output while a full bridge circuit may have two auxiliary outputs that may be combined into one. In the full-bridge case, the second auxiliary output may be a floating output.

One or more embodiments of the present invention use a coupled inductor circuit to steer the ripple away from the primary output. The coupled inductor's behavior may be modeled like an ideal transformer with leakage inductance with the primary winding coupled to the main output capacitor and the secondary winding coupled to the auxiliary output. In one or more embodiments, the auxiliary output may be configured as an additional LC circuit.

In one or more embodiments, the main inductor (in the primary output) may be configured as a coupled inductor circuit, a tapped winding, and other magnetically equivalent structures.

DETAILED DESCRIPTION OF THE INVENTION

The invention comprises a method and apparatus for reducing ripple in Class D amplifiers. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

In general, embodiments of the present invention provide zero ripple class D amplifiers such as may be used for audio reproduction applications. As discussed herein, prior art class D amplifiers require a compromise between ripple and total harmonic distortion (THD) in choosing the corner frequency of the output LC filter. Normally, ripple is compromised in favor of reduced THD. However, the present invention eliminates the need to make the compromise by providing class D amplifiers with the low THD of the prior art but without the ripple. That is, a high performance class D amplifier with low THD and zero switching frequency ripple (alternately "zero ripple").

As illustrated herein, zero ripple may be achieved by adding an auxiliary output to the conventional class D amplifier. It is not necessary that the auxiliary output serve any other useful function except to remove the ripple from the main output. The half-bridge class D configuration has one auxiliary output while the full bridge circuit may have two auxiliary outputs, which may be combined into one in some embodiments. In the full-bridge zero ripple configuration, the second auxiliary output may be configured as a floating output.

Embodiments of the Class D amplifier of the present invention have greatly reduced output inductor current ripple and greatly reduced output capacitor voltage ripple by steering the ripple through an auxiliary output comprising of an additional LC circuit and a modified main output inductor. The modification to the main output inductor may involve using coupled windings, tapped windings, or other magnetically circuits.

Figure 5:
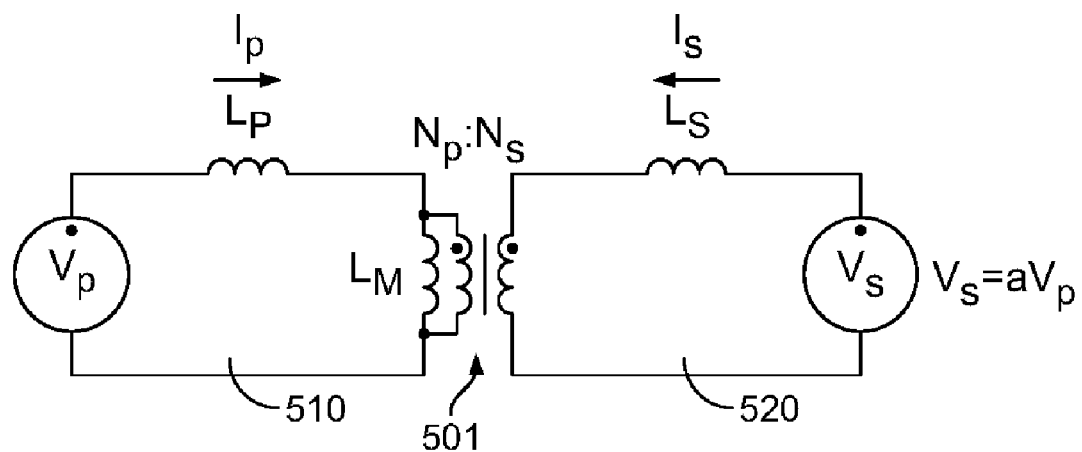
FIG. 5 is an illustration of a coupled inductor circuit as an ideal transformer with lumped parasitic elements being shown with two AC voltage sources connected.

In one or more embodiments of the present invention, a coupled inductor circuit is used to steer ripple away from the main output of the class D amplifier. To visualize how a coupled inductor circuit steers ripple away from a primary output, the coupled inductor is represented as an ideal transformer as shown in FIG. 5.

As illustrated, the principles of a coupled inductor 501 may be represented as an ideal transformer with turns ratio $N_P:N_S$. Where $N_P$ is the number of turns on the primary side winding and $N_S$ is the number of turns on the secondary side winding. The transformer has a finite magnetizing inductance $L_M$; a finite uncoupled inductance $L_P$ on the primary side 510; and a finite uncoupled inductance $L_S$ on the secondary side 520.

In practice, uncoupled inductance $L_S$ may be characterized as the combination of the coupled inductor leakage inductance and a larger discrete inductor. The two sides of the coupled inductor are driven with AC voltage sources, $V_P$ and $V_S$, where $V_S$ may be constrained to be a scalar multiple ("a") of $V_P$, e.g., $V_S=aV_P$. No other constraints need be imposed on $V_S$ and $V_P$, thus they may have any waveform and spectrum. These voltage sources create currents, $I_P$ and $I_S$, that flow into the coupled inductor 501. When the voltage across winding $N_P$ is equal to the primary source voltage $V_P$, then there is no voltage drop across uncoupled inductance $L_P$, and the primary side current $I_P$ is therefore equal zero.

Figure 6:
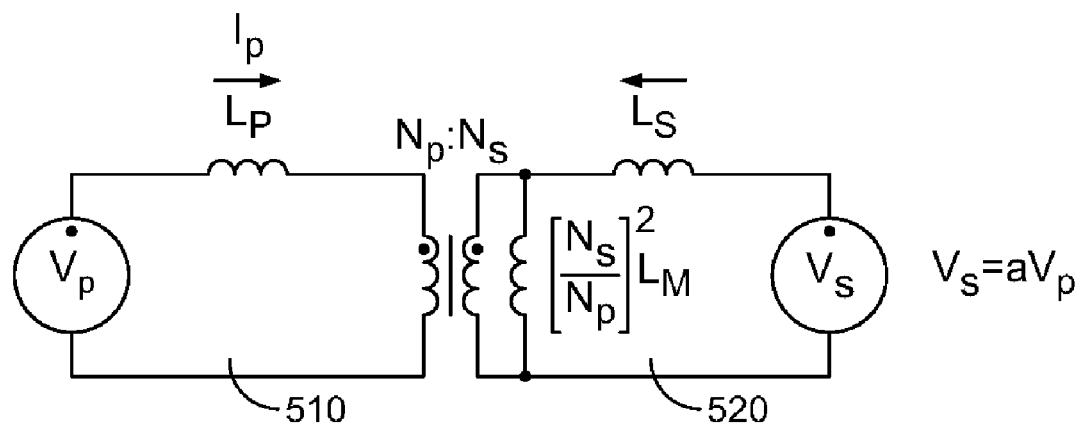
FIG. 6 is an illustration of the coupled inductor circuit redrawn to reflect $L_M$ to the secondary side for better visualization of the voltage divider.

When the secondary voltage source $V_S$ is scaled down by the voltage divider created by uncoupled inductance $L_S$ and the reflected magnetizing inductance $L_M$, then scaled up by the turns ratio $N_P:N_S$, it imposes a voltage on the primary winding $N_P$ that can be made equal to $V_P$, thus satisfying the zero ripple condition. FIG. 6 is an illustration of the coupled inductor circuit redrawn to reflect the magnetizing inductance $L_M$ to the secondary side 520 for better visualization of the voltage divider. Zero ripple condition will exist on the primary windings when the primary side voltage $V_P$ and secondary side voltage $V_S$ are equal so long as there is no voltage drop across the primary windings $N_P$, i.e., voltage on $N_P$ equals to primary side voltage $V_P$. The zero ripple condition is further illustrated below.

As shown in FIG. 6, the magnetizing inductance may be reflected to the secondary side 520 by a transformation equaling the square of the turns ratio. The voltage on the secondary winding $N_S$, denoted VNs, may be calculated with the resulting voltage divider as:

$$VNs = aVp \frac{Lm\left(\frac{Ns}{Np}\right)^2}{Ls + Lm\left(\frac{Ns}{Np}\right)^2}$$

The voltage across the primary winding $N_P$, denoted VNp, is calculated by transforming VNs by the turns ratio.

$$VNp = \left(\frac{Np}{Ns}\right) aVp \frac{Lm\left(\frac{Ns}{Np}\right)^2}{Ls + Lm\left(\frac{Ns}{Np}\right)^2}$$

Since the voltage across $N_P$ must equal $V_P$ for zero ripple, setting VNp to $V_P$ and simplifying terms gives:

$$Vp = \left(\frac{Np}{Ns}\right) aVp \left(\frac{Lm}{Ls\left(\frac{Np}{Ns}\right)^2 + Lm}\right)$$

Further simplifying and rearranging:

$$\left(\frac{Np}{Ns}\right) aLm = \left(\frac{Np}{Ns}\right)^2 Ls + Lm$$

And solving for $L_S$:

$$Ls = Lm \frac{\left(\frac{Np}{Ns}a - 1\right)}{\left(\frac{Np}{Ns}\right)^2}$$

Finally, solving for the case when a=1, that is, $V_S=V_P$:

$$Ls = Lm\left(\frac{Ns}{Np} - \left(\frac{Ns}{Np}\right)^2\right)$$

Under these conditions, zero ripple occurs at the primary winding. Thus, the coupled inductor approach is one way of solving the ripple problem with class D amplifiers. It would be obvious to those of ordinary skill in the arts that other magnetically equivalent methodologies and circuits may also be employed.

Figure 1:
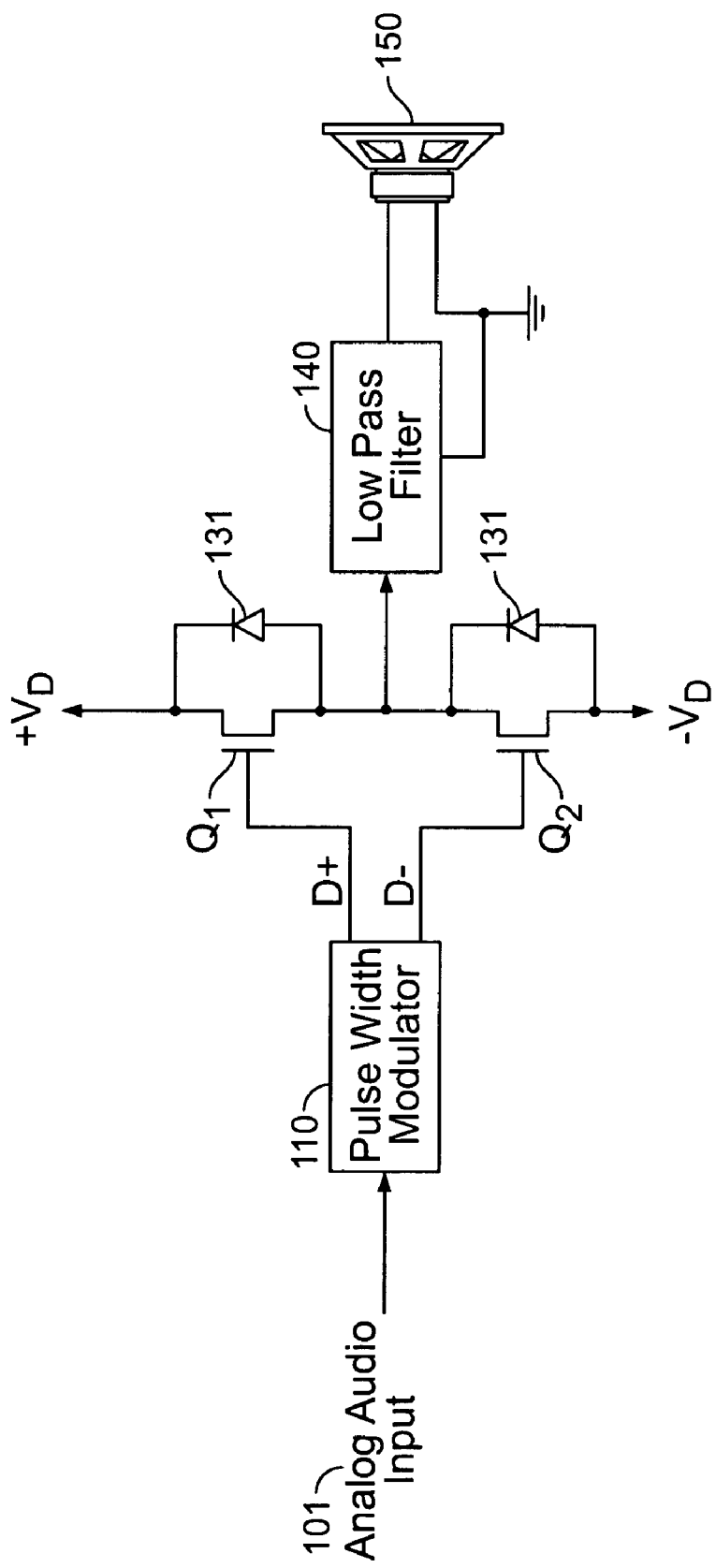
FIG. 1 is an illustration of a simplified Class D topology.
Figure 2:
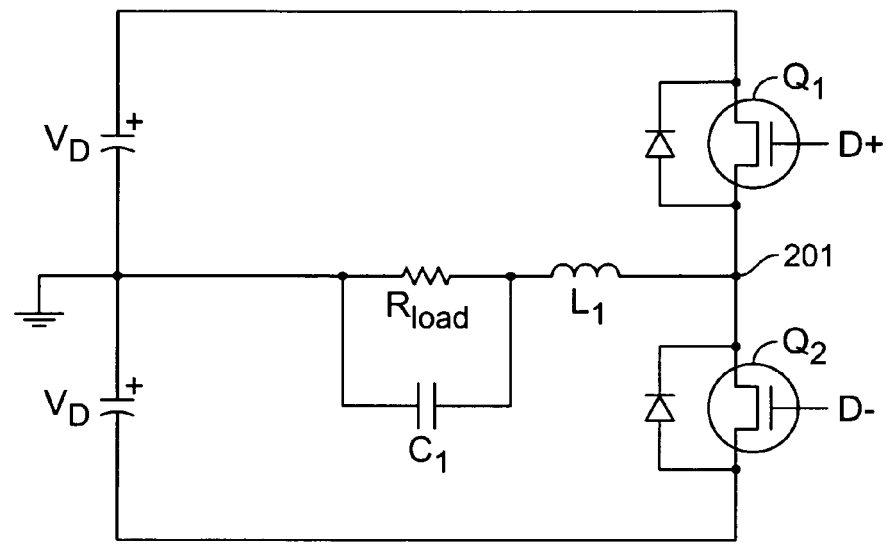
FIG. 2 is an illustration of a typical half bridge class D amplifier configuration.
Figure 4:
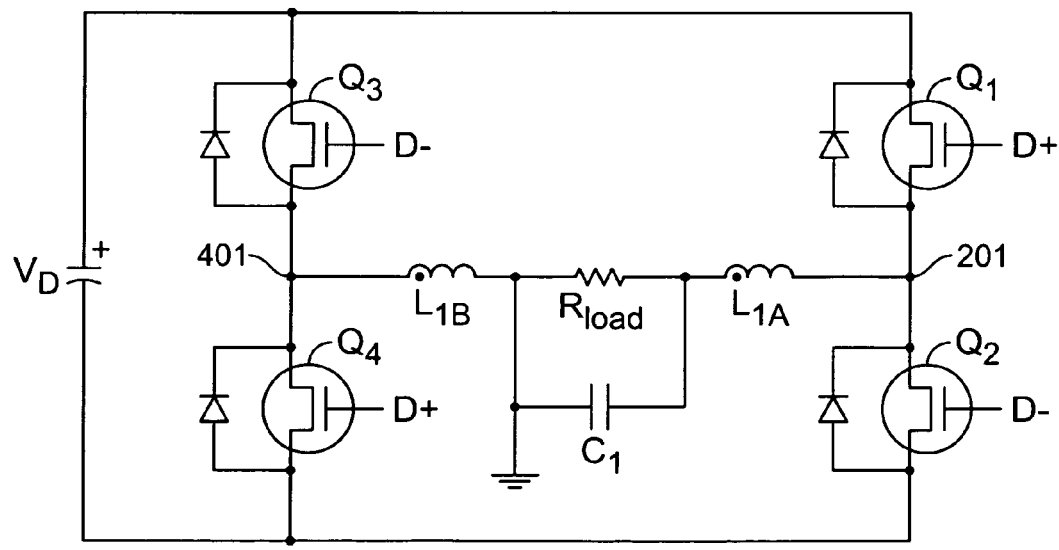
FIG. 4 is an illustration of a typical full bridge class D amplifier configuration.
Figure 7:
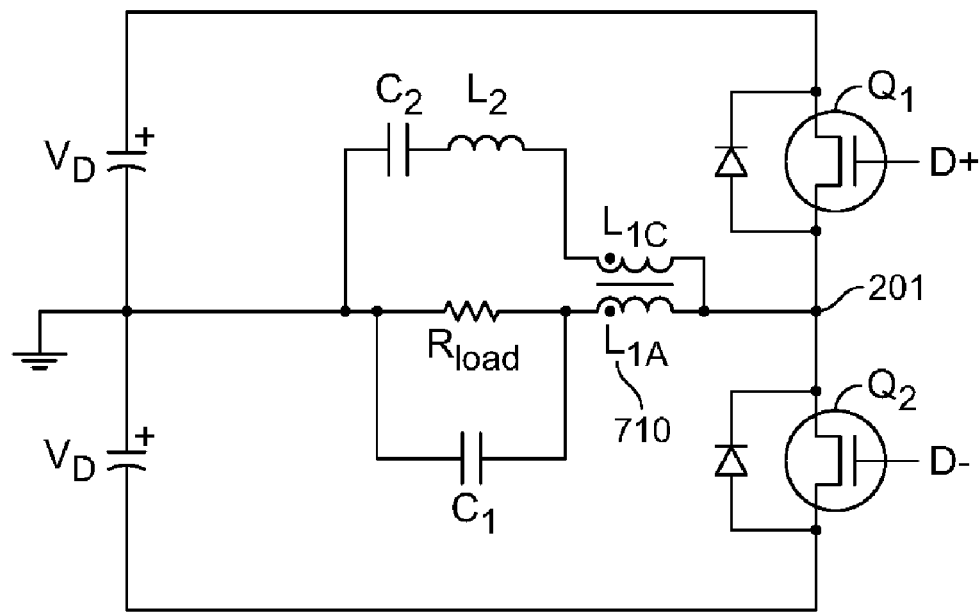
FIG. 7 is an illustration of the coupled inductor approach to ripple steering in the half-bridge configuration.

As is illustrated herein, one or more embodiments of the present invention employ the coupled inductor approach to eliminate ripple artifacts in class D amplifiers. FIG. 7 is an illustration of the coupled inductor approach to ripple steering in the half-bridge class D amplifier configuration. As illustrated, the main inductor 710 comprises a primary winding $L_{1A}$ and a coupled secondary winding $L_{1C}$ in parallel. A first end of both windings $L_{1A}$ and $L_{1C}$, i.e., shown as the end without the dot in FIG. 7, is coupled to switching node 201 (i.e., the connection of MOSFET switches $Q_1$ and $Q_2$). The second end of winding $L_{1A}$ is coupled to capacitor $C_1$, which is then coupled to ground. Thus, winding $L_{1A}$ and capacitor $C_1$ remain configured as the equivalent of the low-pass filter of the prior art (See FIG. 2) with an addition of an auxiliary output using secondary winding $L_{1C}$.

The secondary winding $L_{1C}$ of the coupled inductor 710 forms the basis of the auxiliary output comprising capacitor $C_2$, and inductor $L_2$ in which output capacitor $C_2$ is used primarily for diverting ripple away from the main amplifier (i.e. primary) output, at capacitor $C_1$. As illustrated, the second end of winding $L_{1C}$ is coupled to one end of inductor $L_2$, which is coupled to capacitor $C_2$. Finally, capacitor $C_2$ may be coupled to ground. Thus, capacitor $C_2$ steers ripple away from the primary output.

In this illustration, the low frequency voltages on the main output capacitor $C_1$ and the second output capacitor $C_2$ are identical, because both outputs track the DC value of the switching node 201. Assuming no substantial AC voltage is present on either output capacitor, the AC voltage at switching node 201 is analogous to both $V_P$ and $V_S$ as discussed with the illustration of FIGS. 5 and 6. Thus, this embodiment corresponds to the zero ripple condition on the primary windings since the primary side voltage $V_P$ and the reflected secondary side voltage across $N_P$ are equal.

Figure 8:
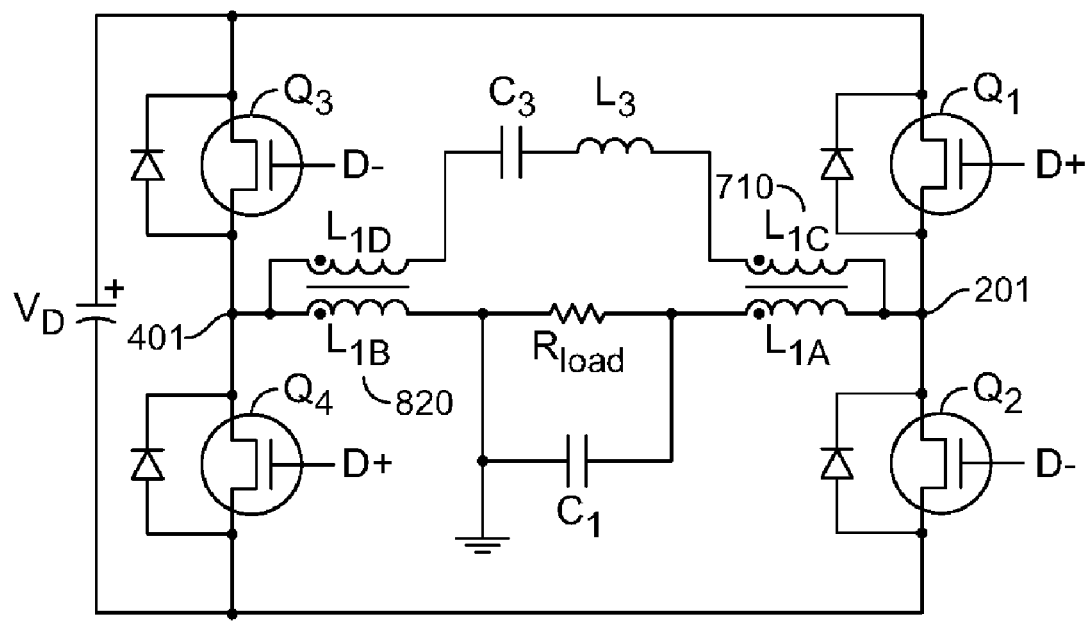
FIG. 8 is an illustration of the full bridge configuration of the coupled inductor embodiment to ripple steering.

FIG. 8 is an illustration of the full bridge configuration of the coupled inductor embodiment to ripple steering. As illustrated, the full bridge configuration involves mirroring the half-bridge architecture of FIG. 7 and combining the two sides. However, when two half bridge configurations are coupled together, the resulting circuit will have two $L_2$ inductors and two $C_2$ capacitors. In one or more embodiments of the present invention, the two resulting inductors $L_2$ are consolidated to create one inductor $L_3$ and the two resulting $C_2$ capacitors are consolidated into one capacitor $C_3$ as shown in FIG. 8.

As illustrated in FIG. 8, a first coupled inductor 710 comprising $L_{1A}$ and $L_{1C}$ is coupled at a first end to switching node 201. That is, the first end of winding $L_{1A}$ may be coupled together with the first end of winding $L_{1C}$ and then to switching node 201. A second coupled inductor 820 comprising $L_{1B}$ and $L_{1D}$ is coupled at a first end to switching node 401. Switching node 401 is the coupling point of MOSFET switches $Q_3$ and $Q_4$. The dot-orientation of both coupled inductors 710 and 820 are in the same direction and as shown in the illustration.

The second end of winding $L_{1A}$ of coupled inductor 710 is coupled to one end of capacitor $C_1$. The other end of capacitor $C_1$ is coupled to ground. In like manner, the second end of winding $L_{1B}$ of coupled inductor 820 is coupled to the other end of capacitor $C_1$, which is coupled to ground.

For the auxiliary outputs, the second end of winding $L_{1C}$ of coupled inductor 710 is coupled to one end of inductor $L_3$, which is coupled to one end of auxiliary output capacitor $C_3$. Finally, the other end of auxiliary output capacitor $C_3$ is coupled to the second end of winding $L_{1D}$ of coupled inductor 820.

Those of skill in the arts would recognize that the coupled inductor windings $L_{1A}$, $L_{1B}$, $L_{1C}$ and $L_{1D}$ may all exist on the same core as a single integrated magnetic structure, and only a single uncoupled inductor $L_3$ and secondary output capacitor $C_3$ are needed. Other embodiments may use two coupled inductors, for instance, $L_{1A}$–$L_{1C}$ and $L_{1B}$–$L_{1D}$.

Figure 9:
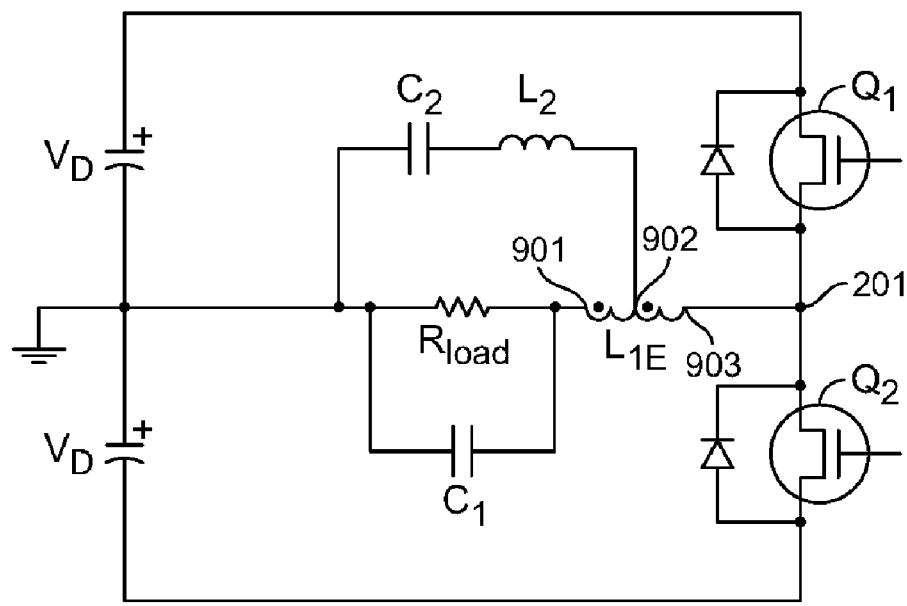
FIG. 9 is an illustration of a zero ripple half bridge configuration using a tapped inductor approach.
Figure 10:
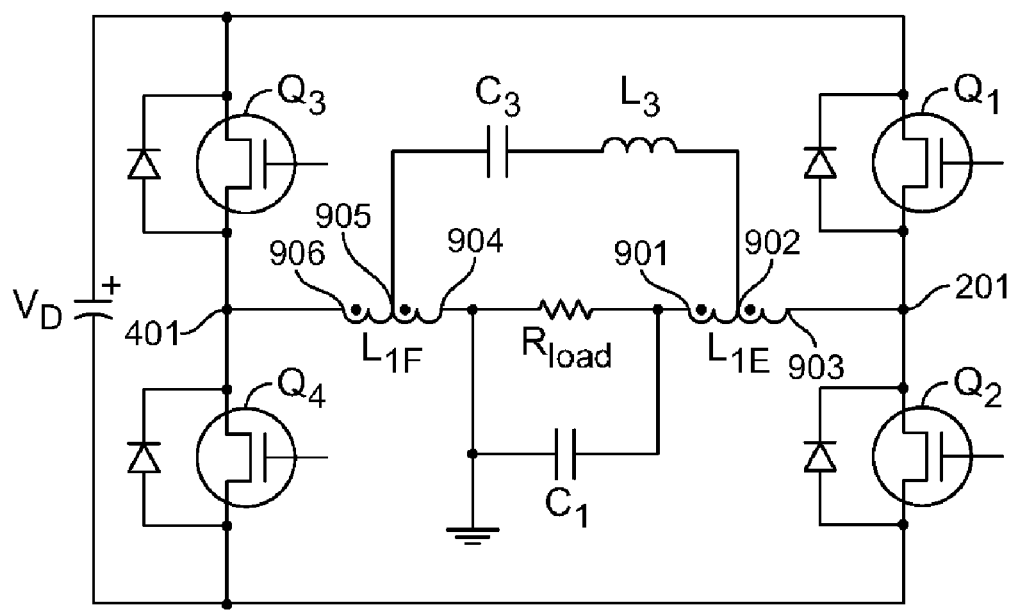
FIG. 10 is an illustration of the full bridge version of the tapped inductor embodiment to ripple steering.

Those of skill in the arts would recognize that there are other configurations that may be magnetically equivalent to those discussed with respect to the embodiments of FIGS. 7 and 8. That is, there may be magnetically other ways to achieve the same behavior discussed with respect to FIG. 7. For instance, since one side of both windings of the coupled inductor is coupled together at the same node, the voltage on the output side of the secondary inductor will be determined by the turns ratio. This voltage ratio may also be realized by the addition of a simple tap on the main inductor winding, as illustrated in FIGS. 9 and 10. This configuration may be an easier winding to manufacture than that discussed with respect to FIG. 7.

FIG. 9 is an illustration of a zero ripple half bridge configuration using a tapped inductor approach. As illustrated, the tapped inductor embodiment involves combining the number of turns that are equivalent between the primary and secondary windings. Thus, as illustrated, the embodiment comprises one inductor $L_{1E}$ with three pins 910, 902, and 903. Pin 903 at the first end of the inductor $L_{1E}$ is coupled to switching node 201. Pin 901 at the other end of inductor $L_{1E}$ is coupled to one end of main output capacitor $C_1$. The auxiliary output is tapped from pin 902 and coupled to inductor $L_2$ and auxiliary output capacitor $C_2$.

The principle of the tapped inductor configuration may be explained using the coupled inductor embodiment of FIG. 7. For example, if the number of turns in the primary windings (e.g. $N_P$) of the coupled inductor 710 is thirty and the number of turns in the secondary windings is twenty four (e.g. $N_S$), then the number of equivalent turns is twenty four. Using the above example, in embodiments that employ the tapped inductor configuration, the main inductor $L_{1E}$ (referring to FIG. 9) will have thirty turns between pins 901 and 903. A secondary tap is included at pin 902, which is located between pins 901 and 903 to represent the number of turns of the secondary winding of $L_{1C}$. In the current example, the tap at pin 902 is located such that there is twenty four turns between pins 902 and 903. Thus, instead of the two windings of the embodiment illustrated in FIG. 7, only one tapped winding may be utilized to magnetically achieve the same result.

FIG. 10 is an illustration of the full bridge version of the tapped inductor embodiment to ripple steering. As illustrated, the full bridge version involves mirroring the half-bridge architecture of FIG. 9 and combining the two sides. However, when two half bridge configurations are coupled together, the resulting circuit will have two $L_2$ inductors and two $C_2$ capacitors. In one or more embodiments of the present invention, the two resulting $L_2$ inductors are consolidated to create one inductor $L_3$ and the two resulting $C_2$ capacitors into one capacitor $C_3$ as shown in FIG. 10. Tapped inductor $L_{1F}$ has a plurality of pins, e.g., 904, 905, and 906. For instance, following the same example discussed above, the number of turns between pins 904 and 906 will be thirty and the number of turns between pins 905 and 906 will be twenty four.

Those of skill in the arts would recognize that the tapped inductor windings $L_{1E}$, and $L_{1F}$ may all exist on the same core as a single integrated magnetic structure, and only a single uncoupled inductor $L_3$ and a single auxiliary output capacitor $C_3$ are needed. Other embodiments may use two tapped inductors in separate cores, for instance, $L_{1E}$ and $L_{1F}$.

As further illustrated in FIG. 10, a first tapped inductor $L_{1E}$ is coupled at pin 903 to switching node 201. A second tapped inductor $L_{1F}$ is coupled at pin 906 to switching node 401. The dot-orientation of both tapped inductors $L_{1E}$ and $L_{1F}$ are in the same direction and as shown in the illustration.

Pin 901 of tapped inductor $L_{1E}$ is coupled to one end of capacitor $C_1$. The other end of capacitor $C_1$ is coupled to ground. In like manner, pin 904 of tapped inductor $L_{1F}$ is coupled to the other end of capacitor $C_1$, which is coupled to ground.

For the auxiliary outputs, pin 902 of tapped inductor $L_{1E}$ is coupled to one end of inductor $L_3$, which is coupled to one end of auxiliary output capacitor $C_3$. Finally, the other end of auxiliary output capacitor $C_3$ is coupled to pin 905 of tapped inductor $L_{1F}$.

Figure 11:
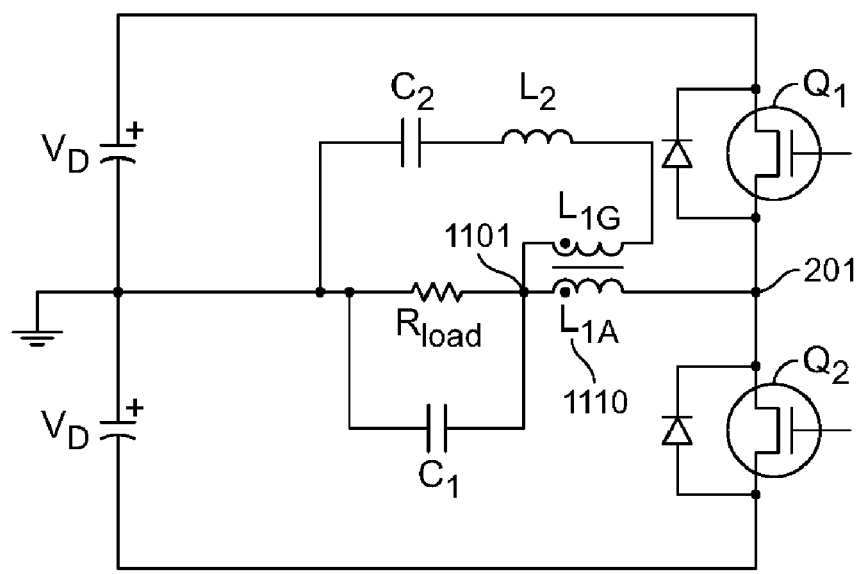
FIG. 11 is an illustration of a zero ripple half bridge class D amplifier using back-wound coupled inductor configuration.
Figure 12:
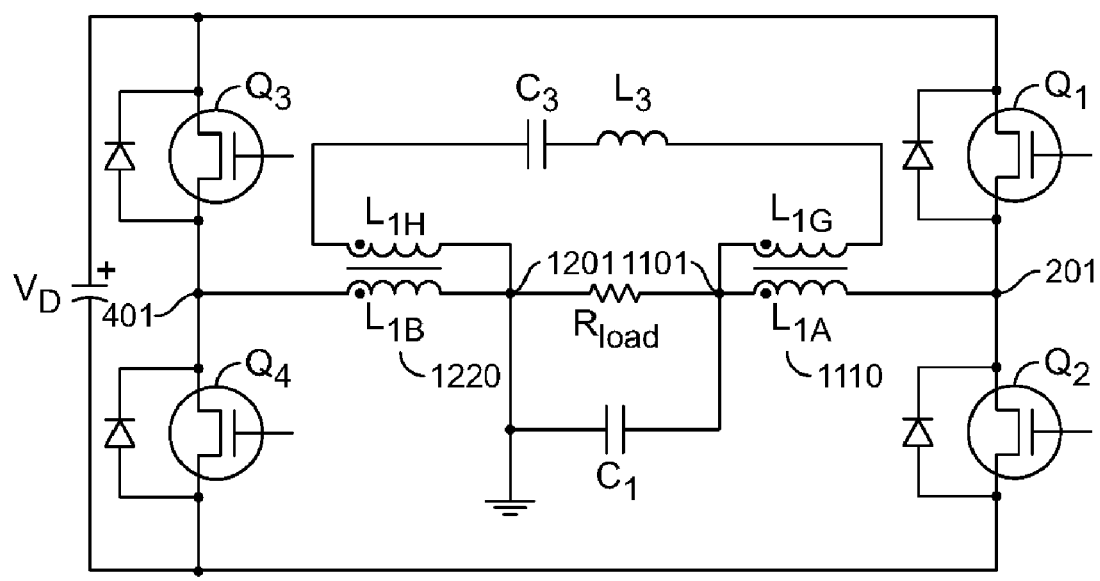
FIG. 12 is an illustration of the full bridge version of the alternate coupled inductor embodiment to ripple steering.

In another embodiment, a magnetically equivalent circuit involves coupling a winding for the auxiliary output to the output side of the main inductor, and winding backwards in a bucking fashion as shown in FIGS. 11 and 12. FIG. 11 is an illustration of a zero ripple half bridge class D amplifier using back-wound coupled inductor configuration. As illustrated, the main inductor 1110 has a primary winding $L_{1A}$ coupled as a normal class D circuit. That is, a first end of winding $L_{1A}$, i.e., shown as the end without the dot, is coupled to switching node 201 (i.e., the connection of MOSFET switches $Q_1$ and $Q_2$). The second end or output end of winding $L_{1A}$ is coupled to capacitor $C_1$, which is then coupled to ground. Thus, winding $L_{1A}$ and capacitor $C_1$ remain configured as the low-pass filter of the prior art (See FIG. 2).

The secondary winding $L_{1G}$ forms the basis of the auxiliary output comprising capacitor $C_2$, and inductor $L_2$ in which output capacitor $C_2$ is used primarily for diverting ripple away from the main amplifier output, at capacitor $C_1$. As illustrated, the second end of secondary winding $L_{1G}$ (the end with the dot) is coupled to the output end of inductor $L_{1A}$ (i.e. node 1101), and back-wound in the same core with winding $L_{1A}$ to the first end. The first end of winding $L_{1G}$ is coupled to one end of inductor $L_2$, which is coupled to capacitor $C_2$. Finally, capacitor $C_2$ may be coupled to ground. Thus, capacitor $C_2$ steers ripple away from the primary output.

Using the same example as before with the primary side inductor having thirty turns, the secondary side inductor $L_{1G}$ is back-wound six turns thus resulting in effectively twenty four turns. This configuration produces nearly the same effect as if twenty four turns of the secondary inductor were coupled to the switching node (see configuration of FIG. 7).

The embodiment illustrated in FIGS. 11 and 12 also produces the same voltage ratio, but with far fewer turns added, these turns optionally being of a much smaller ampacity with respect to the main winding. In addition, the back-wound method may be better for external leakage field reduction on the coupled inductor if a toroidal core is used. This is because the smaller bucking winding can occupy a smaller portion f the toroid circumference, such that each winding, $L_{1A}$ and $L_{1G}$, both have almost the ideal 360 degree winding coverage, which will reduce leakage flux.

FIG. 12 is an illustration of the full bridge version of the alternate coupled inductor embodiment to ripple steering. As in other embodiments discussed herein, the full bridge version involves mirroring the half-bridge architecture of FIG. 11 and combining the two sides. The secondary windings are coupled from the output nodes 1101 and 1201 instead of the switching nodes 201 and 401. When two half bridges are coupled together, the resulting circuit will have two inductors $L_2$ and two capacitors $C_2$. However, one or more embodiments of the present invention consolidates the two resulting $L_2$ inductors into one inductor $L_3$ and the two resulting $C_2$ capacitors into one capacitor $C_3$ as shown in FIG. 12. Those of skill in the arts would recognize that the coupled inductor windings $L_{1A}$, $L_{1B}$, $L_{1G}$ and $L_{1H}$ may all exist on the same core as a single integrated magnetic structure, and only a single uncoupled inductor $L_3$ and secondary output capacitor $C_3$ are needed. Other embodiments may use two coupled inductors, for instance, $L_{1A}$–$L_{1G}$ and $L_{1B}$–$L_{1H}$.

Figure 13:
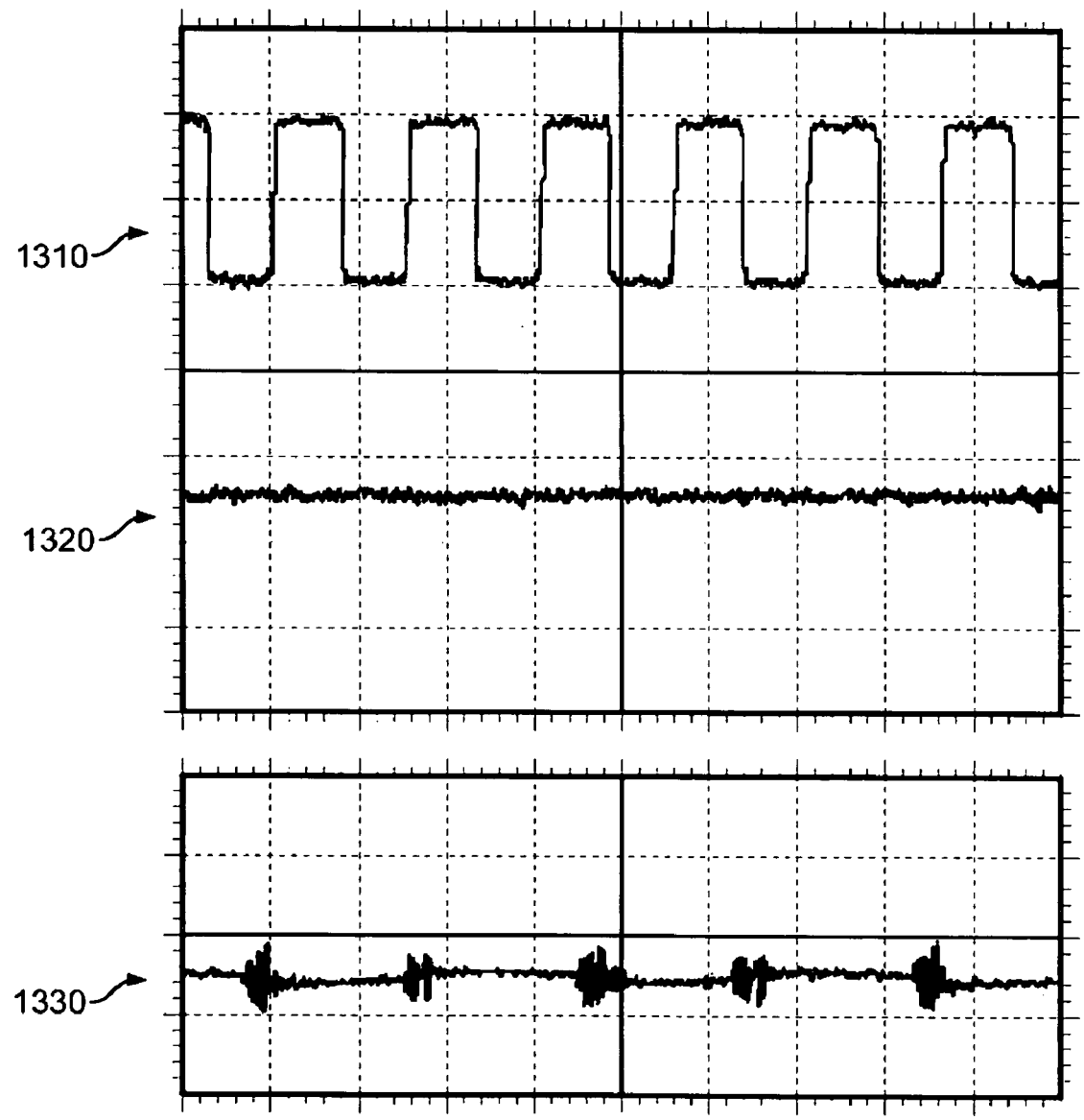
FIG. 13 is an illustration of sample waveforms of a zero ripple class D amplifier in accordance with an embodiment of the present invention.

FIG. 13 is an illustration of sample waveforms of a zero ripple class D amplifier in accordance with an embodiment of the present invention. The waveforms are from a full bridge zero ripple embodiment (see FIG. 8) running at 130 kHz from a 100–200 VDC supply. The class D circuit is optimized for high power and low audio bandwidth and is similar to the circuit used for generation of the waveforms illustrated in FIG. 3 for the prior art. The main class D output filter is comprised of a 200 uH inductor $L_1$ and a 5 uF film capacitor $C_1$. The zero ripple winding comprises $N_P$=30, $N_S$=24, $L_M$=200 uH, resulting in a secondary side uncoupled inductance $L_S$=32 uH. The secondary side uncoupled inductance $L_S$ comprises approximately 7 uH leakage inductance and 25 uH discrete inductance, e.g., $L_3$. Auxiliary output capacitor $C_3$ may be varied within a wide range (e.g. from 5 uF to 1 uF) with no impact on the operation of the zero ripple class D amplifier.

Figure 3:
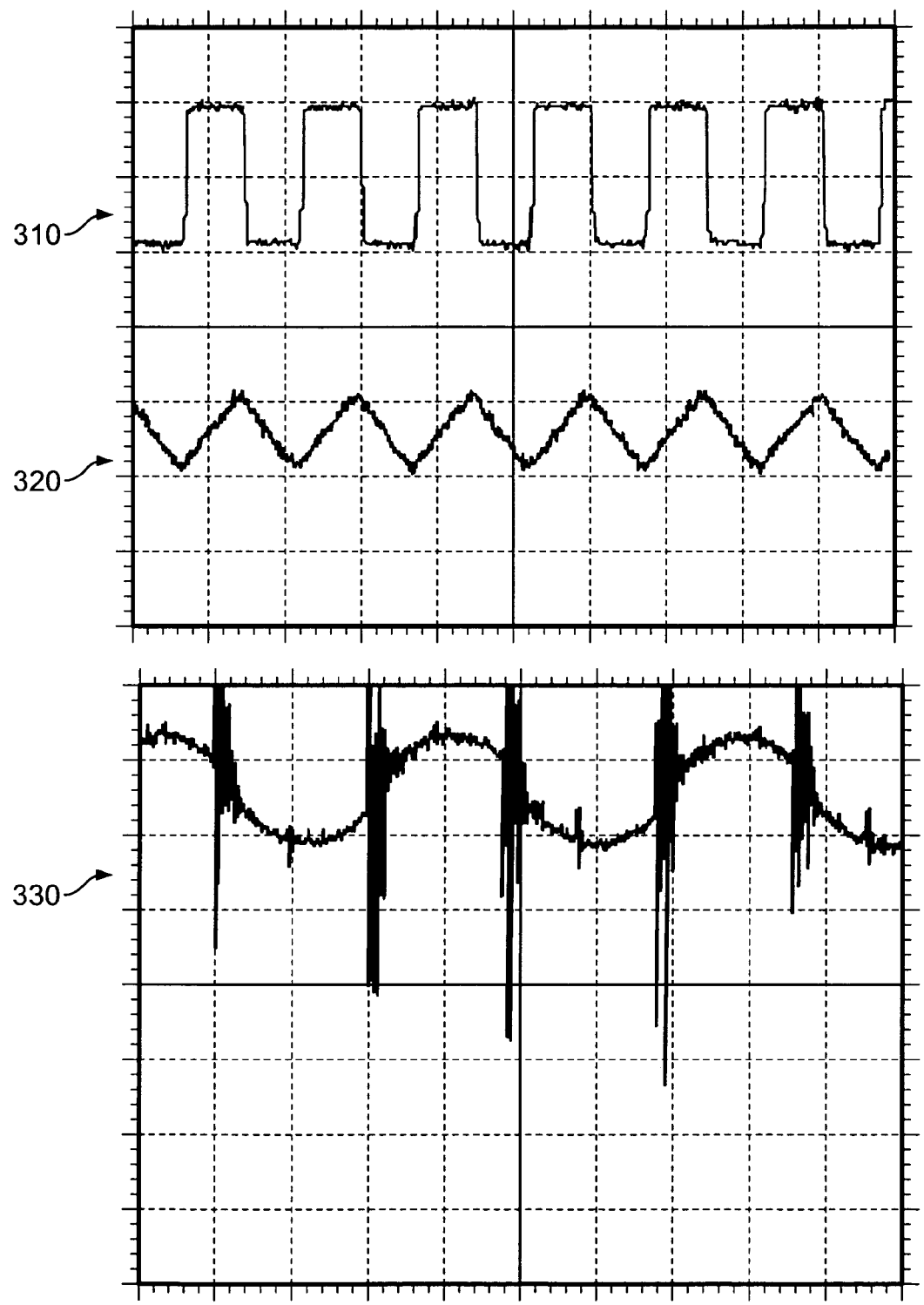
FIG. 3 is an illustration of the waveforms of a prior art class D amplifier showing output ripple.

As illustrated, a square wave voltage 1310 is generated across inductor $L_{1A}$ as a result of the modulator 110 driving the gates of transistors (MOSFETs) $Q_1$ and $Q_2$. The current at the output of inductor $L_{1A}$ is shown as waveform 1320. And finally, the voltage output at capacitor $C_1$ is shown as waveform 1330. In contrast to waveform 330 of FIG. 3 (prior art class D), the ripple characteristic is all but eliminated from waveform 1330. The plots in both FIG. 3 and FIG. 13 are of the same scale.

Note that the values of inductance and capacitance used herein are for illustrative purposes only. Specifically, the circuit used to generate the waveforms of FIG. 13 was optimized for high power and low bandwidth, and thus has a relatively low switching frequency of 130 kHz. And the values of inductance and capacitance reflect this low switching frequency. These values may be much larger than low power full bandwidth circuits applications.

In addition, an additional resonance may exist in the open loop transfer function of the zero ripple Class D amplifier implementation. This additional resonance may be due to the additional inductor and capacitor in the auxiliary output path. This additional resonance may cause a problem when trying to control the system with feedback. Thus, it may be desirable to move the resonance as close to the switching frequency as possible, i.e., out of the way of the closed loop system.

Referring to the half-bridge class D embodiments, the value of the auxiliary output capacitor $C_2$ (e.g. $C_3$ for the full-bridge) is at its lower limit when the switching voltage ripple on $C_2$ interferes with zero ripple operation. Thus simply adjusting $C_2$ may not be adequate to shift the additional resonance to a desirable frequency (e.g. the switching frequency). However, the resonance can also be moved by simultaneously moving the number of turns in the secondary winding Ns very close to the number of turns in the primary winding $N_P$ and decreasing the resonant inductor value. In this manner the resonance may be moved to a much higher frequency with little effect on zero ripple Class D amplifier operation.

It will be understood that the above described arrangements of apparatus and the method therefrom are merely illustrative of applications of the principles of this invention and many other embodiments and modifications may be made without departing from the spirit and scope of the invention as defined in the claims.

What is claimed is:

1. A class D amplifier comprising:
   a first set of switches coupled together to form a first switching node;
   a first coupled inductor circuit having a first primary winding and a first secondary winding, wherein a first end of said first primary winding and a first end of said first secondary winding are coupled to said first switching node;
   a first capacitor coupled to a second end of said first primary winding at one side and coupled to ground at a second side;
   a load circuit coupled to said second end of said first primary winding at a first node and coupled to ground at a second node; and
   an auxiliary output circuit having a first end coupled to a second end of said first secondary winding.

2. The class D amplifier of claim 1, wherein each of said first set of switches comprises a transistor.

3. The class D amplifier of claim 1, wherein said first set of switches is driven by a modulator.

4. The class D amplifier of claim 1, wherein said auxiliary output circuit comprises a secondary inductor coupled to a secondary output capacitor.

5. The class D amplifier of claim 1, wherein said auxiliary output circuit is coupled to ground.

6. The class D amplifier of claim 1, wherein said first capacitor is a primary output.

7. The class D amplifier of claim 1, further comprising:
   a second set of switches coupled together to form a second switching node;
   a second coupled inductor circuit having a second primary winding and a second secondary winding, wherein a first end of said second primary winding and a first end of said second secondary winding are coupled to said second switching node, a second end of said second primary winding is coupled to said second node of said load, and a second end of said second secondary winding coupled to a second end of said auxiliary output.

8. The class D amplifier of claim 7, wherein said auxiliary output comprises a secondary inductor coupled to a secondary output capacitor.

9. The class D amplifier of claim 8, wherein said second end of said second secondary winding coupled to said second end of said auxiliary output comprises coupling said second end of said second secondary winding to said secondary output capacitor.

10. The class D amplifier of claim 7, wherein said first set of switches and said second set of switches are driven by a modulator.

11. The class D amplifier of claim 7, wherein said first coupled inductor circuit and said second coupled inductor circuit are in one core.

* * * * *